United States Patent [19]

Amundson et al.

[11] Patent Number: 4,462,796

[45] Date of Patent: Jul. 31, 1984

[54] INTEGRATED CIRCUIT COMPONENT HANDLER MOVEMENT AND HEATING SYSTEM

[75] Inventors: Arlon J. Amundson, St. Paul; Robert J. Wurscher, Shoreview; Jonathan P. Buesing, St. Paul, all of Minn.

[73] Assignee: Micro Component Technology, Inc., Shoreview, Minn.

[21] Appl. No.: 379,893

[22] Filed: May 19, 1982

[51] Int. Cl.³ .......................... F27B 15/00; F27B 3/22
[52] U.S. Cl. ....................................... 432/58; 406/89; 406/118; 432/176
[58] Field of Search .................... 432/58, 176; 406/86, 406/88, 89, 106, 118; 34/57 R

[56] References Cited

U.S. PATENT DOCUMENTS

| 3,325,157 | 6/1967 | Cook ..................................... 432/58 |
| 3,645,581 | 2/1972 | Lasch, Jr. et al. .................... 406/88 |
| 4,236,851 | 12/1980 | Szasz .................................... 406/86 |

FOREIGN PATENT DOCUMENTS

| 628491 | 4/1936 | Fed. Rep. of Germany ...... 432/176 |
| 2910753 | 10/1980 | Fed. Rep. of Germany ........ 406/89 |

*Primary Examiner*—John J. Camby
*Attorney, Agent, or Firm*—Lawrence M. Nawrocki

[57] ABSTRACT

An air bearing and heating system for use in moving and heating integrated circuit chip carriers (12) prior to their being tested by an electronic tester (10) is the subject of this patent application. The system includes a magazine (18) having a plurality of tracks (24) spaced vertically therein. Each track (24) includes an air-permeable wall (62, 62') through which air in a plenum (52) beneath the wall (62, 62') seeps. The air forms a cushion on the surfaces (64) of the sloped tracks (24) in order to float chip carriers (12), positioned for movement down the tracks (24) therealong.

The air can be heated by a heater (104) prior to the time it is introduced to form the air cushion so that the chip carriers (12) will be heated as they are floated down the tracks (24).

Similarly, the system can be provided with a distribution member (28) by which carriers (12) are conveyed away from the test site (14) of the handler. The distribution member (28) can include a plurality of chutes (30) having structure similar to that of the tracks (24) in the magazine (18). Since carriers (12) passing down the chutes (30) have already been tested, the air creating the flotation cushion therein need not be heated.

12 Claims, 8 Drawing Figures

INTEGRATED CIRCUIT COMPONENT HANDLER MOVEMENT AND HEATING SYSTEM

TECHNICAL FIELD

The invention of the present application deals broadly with the field of semi-conductors and, particularly, integrated circuits. More narrowly, the invention is related to the field of testing of such integrated circuits for proper performance characteristics. The invention specifically relates to handlers for maneuvering chip carriers containing such circuits into engagement with contacts at a test site interfacing with the tester, and for maneuvering such carriers in such a manner so that damage to fracturable components thereof is minimized while the carrier passes through both a magazine at the input end of the handler and classification bins at an output end of the handler. Additionally, the invention facilitates elevation of the integrated circuits to a test temperature at least as high as a temperature at which the circuits are maintained during operation of devices in which the circuits are to be subsequently installed.

BACKGROUND OF THE INVENTION

The relatively recent development of the semi-conductor has fairly revolutionized the electronics industry. The development of transistors and integrated circuits has induced the rethinking of manufacturing philosophies and has been responsible, in significant part, for the availability of many new products not previously commercially feasible because of size and expense constraints.

The revolution has greatly affected the consumer oriented market. While only a few decades ago products such as pocket calculators were virtually unimaginable, the new semi-conductor technologies have made them a reality.

This electronics revolution has not, however, been restricted to the consumer market. Rather, its effects have impacted even more significantly upon the industrial, governmental, and defense markets.

A basic motivation in the development of the integrated circuit was a desire by manufacturers of semiconductors to improve performance beyond that obtained by transistors and to reduce costs. The integrated circuits did accomplish this goal, but, as in the case of virtually all manufactured products, defects can be introduced into units as various processes are performed in the manufacturing steps. Manufacturers of integrated circuits do, therefore, observe quality control procedures in order to maximize the performance characteristics of integrated circuit units they manufacture.

To this end, various types of IC testers have been developed. These testers can assume one of a multiplicity of forms. They can be large consoles or comparatively small test sets. Contacts of the tester are electronically connected to corresponding contacts of an IC chip carrier at a test site of a chip carrier handler apparatus. The tester is connected to the test site by appropriate means, and, as a multiplicity of chip carriers are consecutively processed by the handler, each is brought into engagement with contacts at the test site.

Many of the tester apparatuses commercially available in the marketplace are capable of high speed testing wherein each integrated circuit can be tested in a period of microseconds. Typically, as many as three integrated circuits can be tested per second. For this reason, it is necessary that a handler for feeding the chip carriers into a test site for testing be capable of operating at a high speed.

While speed is a necessary characteristic for a chip carrier handler, it is equally important, if not more important, that the carriers be handled in a manner such that damage thereto is minimized. The typical IC semi-conductor is mounted to a ceramic substrate and connected to contact pads located proximate the periphery of the substrate by one of a number of methods. These methods include the nail head bond method, the flip chip method, and the beam lead method. The IC, as mounted to the ceramic substrate, is, thereafter, overlain with a plastic layer or a resin having appropriate characteristics in order to protect the silicon chip.

A ceramic substrate is utilized for a number of reasons. Not only does ceramic material have appropriate electrical conductivity properties, but it also has a high co-efficient of heat conductivity so that heat generated within the IC during its operation in a device in which it is subsequently installed is dissipated away from the chip for protective purposes.

Nevertheless, ceramics do have certain characteristics which, although not outweighing the advantages obtained by using a ceramic material, can be fairly significant. Specifically, ceramic material tends to be fragile, and the ceramic substrate portion of chip carriers can become fractured during handling if adequate steps are not taken to protect the carrier.

Prior art devices for handling chip carriers have, typically, relied upon frictional engagement between the carriers and tracks upon which the carriers are allowed to slide in passing through a feed magazine. In order to overcome the coefficient of friction between the carriers and the surface of the track, the magazine has been angled at a sufficient degree in order to overcome the coefficient of friction. Tracks have often had to be angled as much as 35° relative to the horizontal.

Such attempted solutions have created certain problems of their own. These problems include the possibility of damage to the carriers as a result of the generation of momentum once the coefficient of friction has been overcome.

An additional problem which such an attempted solution presents is the possibility of damage resulting to the carriers because of the abrasion between the carriers and the surface of the track. Again, because of the fragile nature of ceramic substrates, a number of the carriers can be damaged beyond their ability to be used.

Similarly, movement of chip carriers through classification bins at the output end of a handler has been accomplished in a like manner. The classification bins have merely been angled to a sufficient degree so that the force of the carriers along the track surfaces will be sufficient to overcome the coefficient of friction between the carriers and those surfaces.

Because of the environments in which integrated circuits are designed to operate, it is desirable that chip carriers incorporating such integrated circuits be brought at least to a temperature to which they will be raised when placed in devices in which they are intended to function prior to the performance of any testing of quality of operation. Further, it is desirable that the temperature be maintained not only through the period during which the carriers are fed to the test site, but also until the testing is completed. Actual operating conditions are, thereby, simulated.

It is to these and other problems in the prior art that the invention of the present application is directed. It provides a system for both heating and soft handling of carriers as they are fed toward the test site and distributed in classification bins.

SUMMARY OF THE INVENTION

Broadly, the invention of the present application is an apparatus for moving semi-conductor component carriers such as integated circuit chip carriers to and away from a carrier handler device test site which electronically interfaces with a component tester. Portions of the apparatus which move the carriers to the test site include at least one sloped track angling downwardly as the track approaches the test site. The track includes an air-permeable wall which has a generally upwardly facing surface. Chip carriers move down the generally upwardly facing surface as they are fed toward the test site. The apparatus further includes means for creating an increased pressure beneath the air-permeable wall of the track. Because of the air-permeability of the walls, air will pass therethrough and form an air film on the generally upwardly facing surface. Consequently, chip carriers positioned on the wall will be floated above the surface thereof, and movement of the carriers down the wall to the test site will be facilitated.

In a preferred embodiment, the degree which the surface of the wall is angled with respect to the horizontal is sufficiently small so that, under normal circumstances, the coefficient of friction between the carrier and the surface will preclude movement in a downwardly direction toward the test site. Consequently, operations in which carriers are fed to the test site will occur only when the increased pressure is induced beneath the wall in order to obtain the air film on the generally upwardly facing surface.

The structure by which chip carriers are conveyed away from the test site after completion of testing is similar in both configuration and operation. It includes at least one sloped chute angling downwardly away from the test site. As in the case of the track by which carriers are fed to the test site, the sloped chute includes an air-permeable wall having a generally upwardly facing surface along which the carriers move away from the test site. Means are included for inducing an increased pressure beneath the air-permeable wall of the chute in order to create the air film on the surface of the chute in order to float the carriers to allow them to overcome the coefficient of friction relative to the surface.

In the case of both the track by which carriers are fed to the test site and the chute by which carriers are conveyed away from the test site, it has been found that an optimum angle relative to the horizontal at which these structures can be angled is substantially 8°. The angle does, of course, vary depending upon the materials from which the track, chute, and carriers are manufactured. The angle can, therefore, appropriately vary anywhere between 1° and 11°, and even larger angles if certain materials are used.

In a preferred embodiment, a magazine having a plurality of vertically spaced tracks can be used to feed chip carriers to structural means for consecutively introducing single chip carriers into the test site. As many as ten vertically spaced tracks can be provided within the magazine, with each track being capable of accommodating approximately 20 chip carriers.

Each track can be provided with a plenum beneath the air-permeable wall, and the plenums can, in turn, communicate with a manifold chamber. A blower unit having an compartment for moving heated air to the manifold chamber can be provided for that purpose. Heated air can, therefore, function to both form the air film on the generally upwardly facing surfaces of the tracks and to heat chip carriers passing down the tracks to the test site to at least a temperature at which the carriers will be maintained during operation of devices in which they are subsequently installed. It is desirable to heat the carriers, prior to the time at which they are introduced into the test site, to a temperature of 160° centigrade.

Because of the large number of stations within a magazine which are provided when the magazine has ten tracks, each capable of accommodating 20 carriers, the carriers can be exposed to the heated air for a sufficient time in order to raise their temperature to 160° centigrade prior to the time when they are tested. Since only one carrier is fed into the test site at any one particular time, the other approximately 199 carriers can continue to be heated. Although chips are typically tested at high rates of speed of approximately three per second, those last positioned in the magazine will be subjected to heating for a period in excess of 60 seconds. If the temperature of heating air is sufficiently high, elevation of the carriers to a temperature of 160° Centigrade can be accomplished without retarding a continuous testing process.

In order to conserve thermal energy and minimize the demands upon any heater unit used in conjunction with the hot air compartment of the blower unit, a thermally sealed hot air recirculation circuit can be provided. This circuit can include the hot air compartment of the blower unit, a heater, conduit means for delivering heated air to the manifold chamber, the manifold chamber, the plenums, and duct means for returning the heated air to the hot air compartment of the blower unit.

A take off from the conduit means can also be provided to feed hot air to the test site so that the desired temperature of the chip carriers can be maintained through the time they are tested. Hot air delivered to the test site can, in turn, be returned to the hot air compartment of the blower unit, and this branch circuit can, further, comprise part of the thermally sealed system.

The blower unit can further include an ambient temperature air compartment which provides the increased air pressure generated beneath the air-permeable wall or walls of the sloped chutes which convey the chip carriers away from the test site. Since the carriers need not be heated during this phase of their processing, the air generating the film on the surfaces of the chutes need not elevate the temperature of the carriers.

As will be seen, the invention of the present application is a system which provides for not only soft handling of the carriers as they pass through the handler apparatus during the conduct of testing operations, but also heating of the carriers to a temperature at which it is desirable to conduct testing. More specific features and advantages obtained in view of those features will become apparent with reference to the detailed description of the invention, appended claims, and accompanying drawing figures.

DETAILED DESCRIPTION OF THE INVENTION

Figure 1:
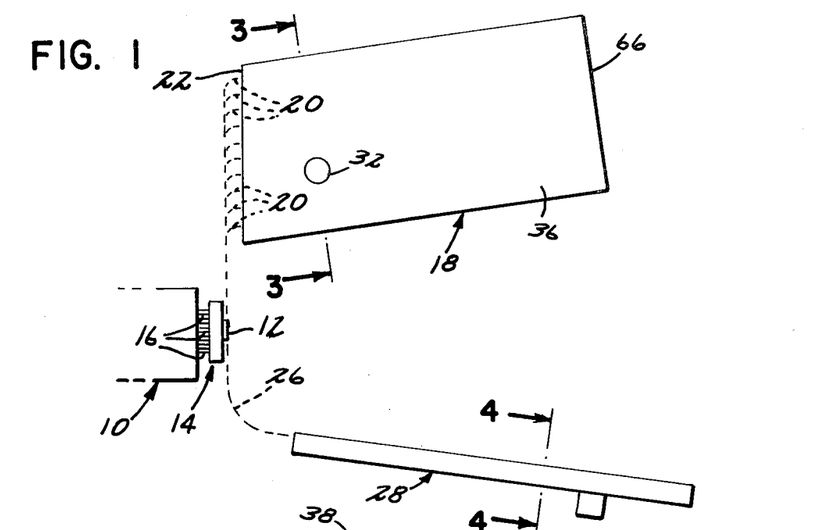
FIG. 1 is a schematic illustration of a magazine, test site, and distribution member in accordance with the invention of the present application.

Referring now to the drawings wherein like reference numerals denote like elements throughout the several views, FIG. 1 illustrates schematically a structure embodying the invention of the present application. Reference numeral 10 is used to indicate a tester, shown in phantom, by which integrated circuit chips mounted within carriers 12 are electronically tested for quality of operation and quantity of circuit portions functioning properly. A test site 14, typically, an integral portion of a handler device, is shown as communicating electronically with the tester 10. The test site 14 includes a plurality of pins (not shown), each conversing with the tester 10 through a connector 16. A chip carrier 12, when fed to the test site 14, is moved into engagement with the pins so that each of the pins is engaged by one of a plurality of contact pads typically formed about the periphery of one planar surface of the carrier 12.

Chip carriers 12, although assuming one of a number of configurations, are usually generally planar structures having oppositely facing flat surfaces. The contact pads are formed in one of the surfaces. Typically, the carriers 12 are generally square in cross-section.

In storage, chip carriers 12 are maintained in a "stick" having an elongated slot formed therein. The slot has a width slightly larger than an edge of a chip carrier 12 to be stored therein. Similarly, the slot has a thickness slightly larger than the thickness of the carriers 12. The carriers 12 can, therefore, be fed into a stick in a particular orientation so that, when they are subsequently fed into the handler for movement to the test site 14, they will be properly oriented with respect to the various pins at the test site 14 so that valid results are obtained.

The "stick" can be of a length to accommodate any number of carriers 12 desired. A typical stick which would be used with the invention of the present application would accommodate approximately twenty carriers 12, since a track onto which the carriers in the stick would be fed is designed to accommodate approximately that number. This is in accordance with a purpose to be described hereinafter.

Figures 3, 7, 8:
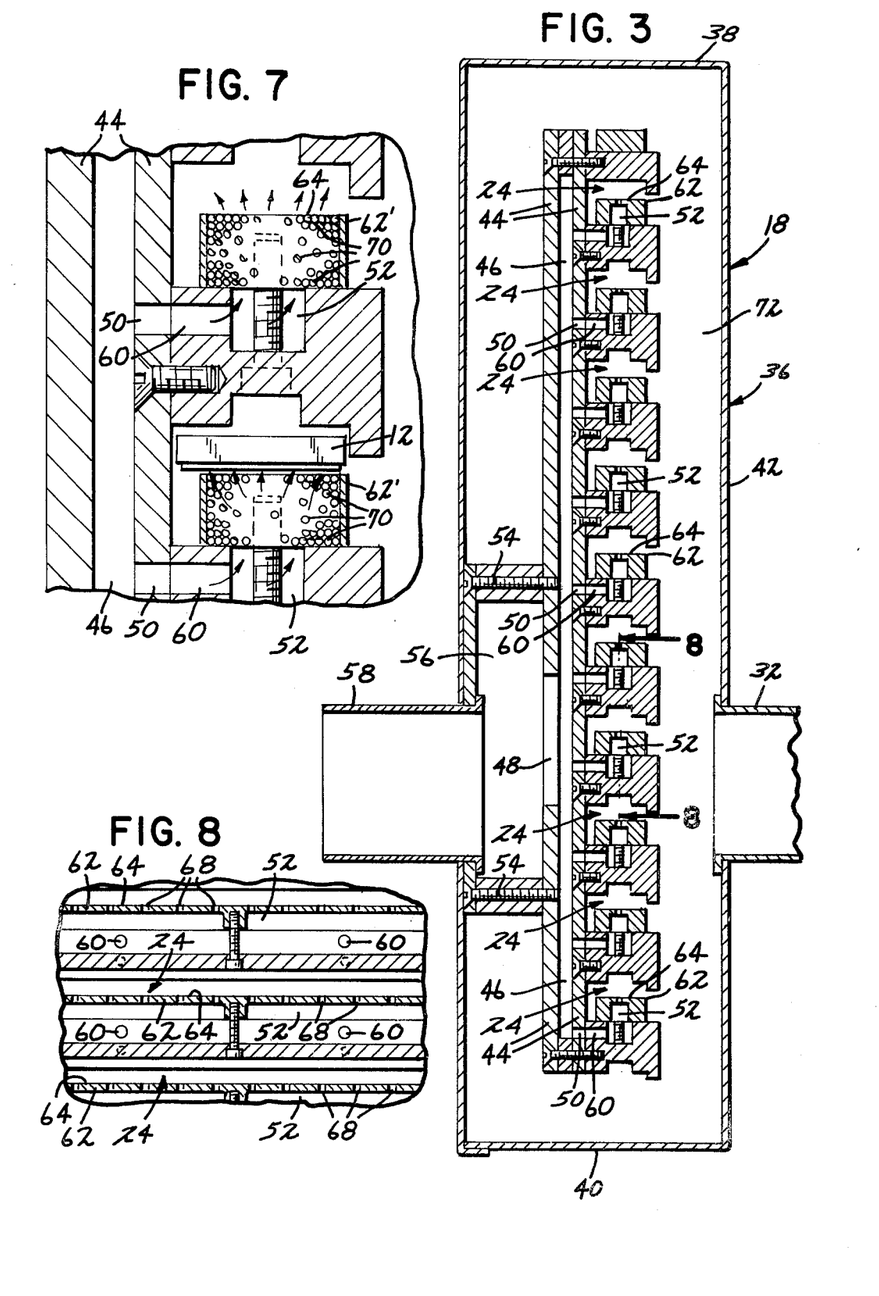
FIG. 3 is a view taken generally along the line 3—3 of FIG. 1.
FIG. 7 is an enlarged view, similar to FIG. 3, illustrating an alternative embodiment of an air-permeable wall.
FIG. 8 is a view taken generally along the line 8—8 of FIG. 3.

FIG. 1 illustrates a magazine 18 positioned slightly above and slightly to the right of the test site 14. As illustrated by the number of chip carrier paths 20 exiting from the magazine 18 at its output, or left, end 22, the magazine 18 can include ten tracks 24, each being capable of receiving as many as twenty chip carriers 12. As seen in FIG. 1, the paths 20, and, consequently, the tracks 24, are vertically spaced. As seen in FIG. 3, the tracks 24 are shown as being aligned vertically. The magazine 18 can, thereby, be a relatively narrow structure.

Referring again to FIG. 1, a chip carrier 12 which has exited the magazine from one of the tracks 24 is shown at the test site 14 as being oriented generally vertically. It will be understood that it is not necessary to the invention that such an orientation be accomplished.

Figure 4:
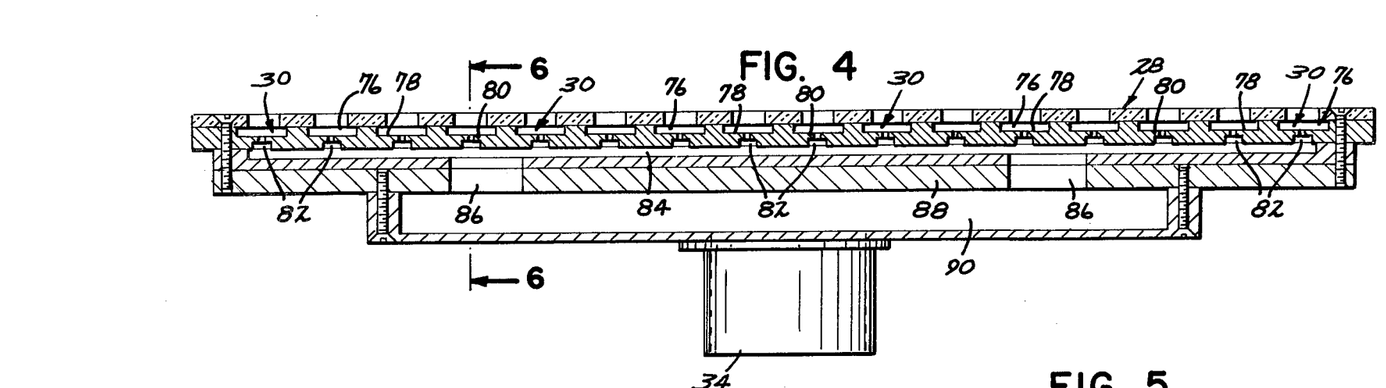
FIG. 4 is a view taken generally along the line 4—4 of FIG. 1.

The path 26 of the chip carrier 12, as shown in phantom, continues past the test site 14 and to a distribution member 28. The distribution member 28 includes at least one sloped chute 30 for receiving chip carriers 12 after they have exited the test site 14. Since the function of testing IC chips is to ascertain which of the many tested possess various levels of quality, the distribution member 28 can include a plurality of chutes 30 spaced horizontally defining a common plane. This arrangement is best seen in FIG. 4. Each of the chutes 30, thereby, serves as a classification bin in which the tested IC chips are sorted by an appropriate sort shuttle (not shown) as known in the prior art.

FIG. 1 further illustrates air fittings 32, 34 affixed to both the magazine 18 and the distribution member 28. The purpose and function of these fittings 32, 34 will be described hereinafter.

Referring now to FIGS. 3 and 8, the structure of the magazine 18 and the vertically spaced and aligned tracks 24 therein is shown in more detail. The magazine 18 includes an enclosed housing 36 having upper and lower walls 38, 40 and a peripherally enclosing side wall 42. The track array includes a series of panels 44 defining a manifold chamber 46, enclosed except for an ingress aperture 48 through which air enters the chamber 46 and a plurality of egress orifices 50 through which air, which has entered the chamber 46, is distributed to plenums 52, one underlying each of the tracks 24 over which the IC chip carriers 12 pass. The walled manifold chamber 46 is held in position generally centrally within the magazine 18 being affixed by appropriate means such as screws 54 to another chamber 56 communicating with the air inlet fitting 58. The portion of the wall of the manifold chamber 46 which has the ingress aperture 48 formed therein overlies this chamber 56 so that fluid communication exits from the air fitting 58, through the chamber 56, through the manifold chamber 46, and into the plenums 52.

Each of ten vertically spaced tracks 24 is mounted to a side panel 44 enclosing the manifold chamber 46. A port 60 in each track 24 is made to register with one of the orifices 50 in the panel 44 enclosing the mainfold chamber 46 in order to insure fluid communication between the manifold chamber 46 and the plenums 52.

Each track 24 comprises a wall 62 having a generally upwardly facing surface 64 down which chip carriers 12 pass from the input end 66 of the magazine 18 to the output end 22 thereof. The walls 62 of the tracks 24 are provided with a measure of air-permeability so that, if air is fed continuously into the plenums 52 from the manifold chamber 46, air pressure in the plenums 52 will increase and air will seep through the walls 62 and outwardly through the generally upwardly facing surfaces 64 thereof.

As seen in FIG. 1, the top and bottom walls 38, 40 of the magazine 18 are sloped downwardly from the input end 66 to the output end 22 of the magazine 18. The tracks 24 are, similarly, sloped downwardly.

In prior art chip carrier handlers, carriers 12 are generally fed through a magazine by gravity. Because of the coefficient of friction between the carriers 12 and the surfaces 64 of the tracks 24, it has been necessary to angle the tracks 24 so that surfaces 64 along which the carriers 12 move have an angle relative to the horizontal of up to, and in excess of, thirty-five degrees. As indicated in the BACKGROUND OF THE INVENTION portion of this application, however, such angling allows the carriers 12 to achieve a degree of momentum once they do move, wherein damage can occur to the carriers and contact pads.

Because of the structure of the tracks 24 described herein, the angle of the sloped surfaces 64 can be reduced to a measure significantly less than that in the prior art. It has been found that a range of angling between one degree and eleven degrees is appropriate. A particularly effective angle of inclination of the tracks 24 has been found to be eight degrees. In consequence, the problem of the carriers 12 achieving a high degree of momentum is overcome.

As carriers 12 are inserted onto one of the tracks 24 through the input end 66 of the magazine 18 and as air is introduced into the particular plenum 52 below the track's surface 64, the air will pass upwardly through the air-permeable wall 62 and levitate the chip carriers 12 so that the coefficient of friction between the carriers 12 and the surface 64 is overcome. Because of the small measure of angling, however, movement of the carriers 12 will be slow, and soft handling will be achieved.

As seen in FIG. 8, air-permeability of the wall 62 can be effected by providing the wall 62 with a multiplicity of perforations 68. The perforations 68 can be aligned longitudinally along the axis of elongation of the track 24. Spacing between perforations 68 should, of course, be smaller than a dimension of the carriers 12 in the directions in which they move. Air flow will, thereby, be induced beneath each carrier 12.

As the air exits from the perforations 68, it will engage under surfaces of the carriers 12, raise the carriers 12 off the track surfaces 64, and diffuse from the area of the perforations 68 through which it has exited from the particular plenum 52. An air cushion will, thereby, be created substantially completely under the ship carrier 12. In order to equalize the pressure levitating the carriers 12, the perforations 68 can be spaced at equal intervals.

FIG. 7 illustrates an alternative embodiment of an air-permeable wall 62' which can be used for each of the tracks 24 in the magazine 18. The alternative wall comprises a multiplicity of beads 70 fused closely together. It has been found appropriate to use a network of fused glass beads 70 in order to effect air-permeability. Such a wall 62' would, unlike a wall 62 having a multiplicity of aligned perforations 68, have a multiplicity of interstices between the beads 70. Air passing through the wall 62' would, therefore, diffuse more in order to effect a more uniform air cushion.

After effecting the air cushion function, air would, in response to pressure differentials, flow into a third chamber 72 extending generally about the track array. Thereafter, it could pass through an outlet fitting 32 back to a blower unit 74.

Figure 6:
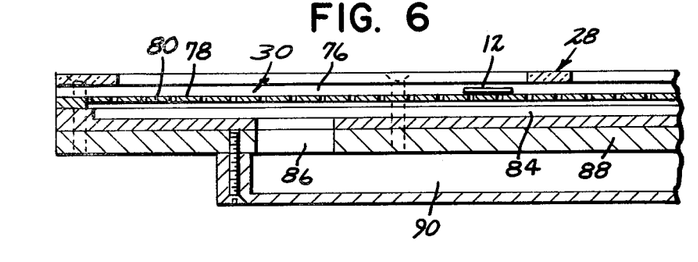
FIG. 6 is a view taken generally along the line 6—6 of FIG. 4.

As chip carriers 12 are dispensed at the bottom of the tracks within the magazine 18, they are received by means, such as a conveyor, for introducing the carriers 12 consecutively into the test site 14. Similarly, after carriers 12 are ejected from the test site 14, they can be fed into one of plurality of classification bins 76, each having as previously described, a sloped chute surface 78. Referring more specifically to FIGS. 4 and 6, a distribution member 28 having sixteen different classification bins 76 is illustrated. It will be understood, however, that the member 28 need not have this specific number of bins 76 nor, if such a number is provided, do all the bins 76 need be used during testing operations.

Although the chutes 30 of the distribution member 28 are aligned horizontally while the tracks 24 of the magazine 18 are aligned vertically, a structure for inducing an air cushion on the surfaces 78 of the chutes 30 similar to that of the tracks 24 in the magazine 18 can be provided. Each chute 30 can be structured with an air-permeable wall 80 overlying a plenum 82. The plenums 82, in turn, communicate with a manifold chamber 84 which is supplied with air through two ports 86 in a wall 88 separating the manifold chamber 84 from a chamber 90 into which air is received from an inlet fitting 34. All of the elements are operatively connected so that air, introduced through the inlet fitting 34 enters the chamber 90, passes through the ports 86 into the manifold chamber 84, and enters the plenums 82 so that carriers 12 passing down the chutes 30 can be floated on an air cushion to effect soft handling.

As in the case of the sloped tracks 24 of the magazine 18, the chutes 30 of the distribution member 28 can have an air-permeable wall 80 formed either as a continuous bar with a multiplicity of perforations spaced and aligned along an axis along which the carriers 12 move from the input end to the output end of the member 28 or as a network of fused glass beads. In either case, the operation is similar to that of the tracks 24 of the magazine 18.

As in the case of the magazine tracks 24, the chutes 30 can extend from an input end of the distribution member 28 to an output end thereof at an angle relative to the horizontal between one degree and eleven degrees. Also as in the case of the magazine tracks 24, eight degrees has been determined to be the optimum angle. As the chip carriers 12 pass down the generally upwardly facing surfaces 78 of the sloped chutes 30, therefore, soft handling is effected.

Figure 2:
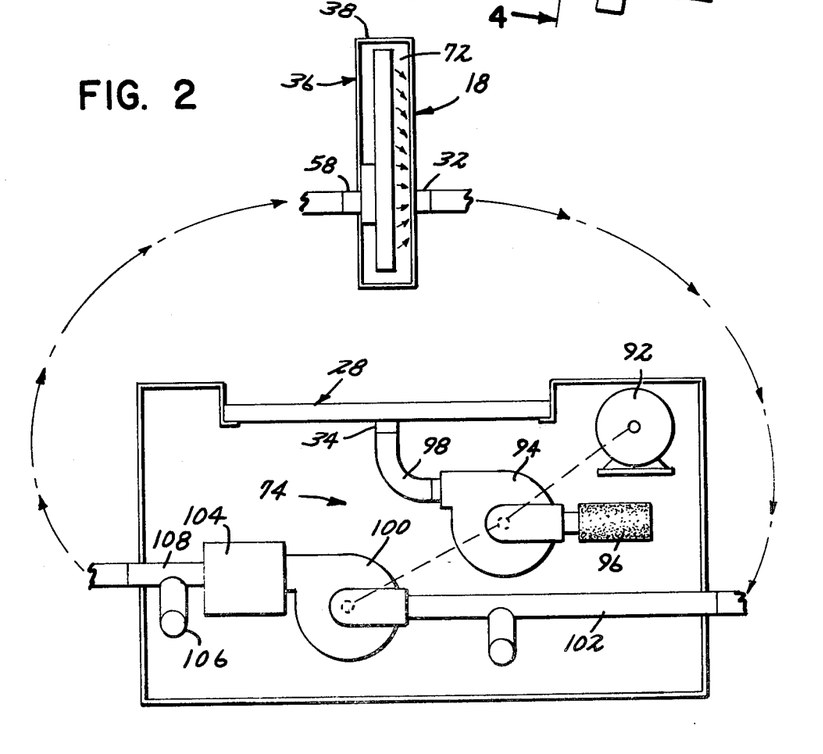
FIG. 2 is a schematic illustration of the magazine and distribution member of FIG. 1 in combination with a blower unit.
Figure 5:
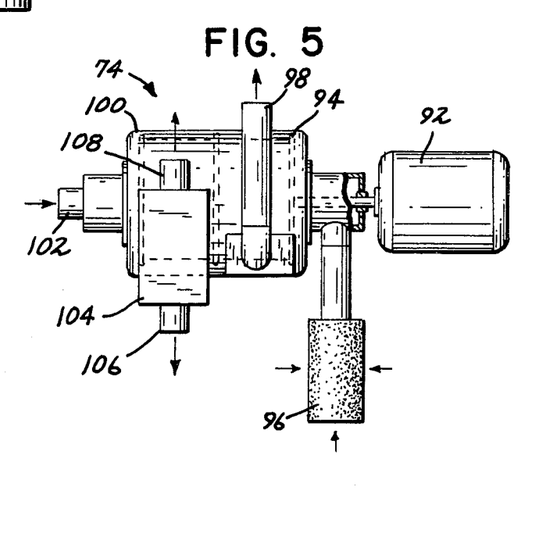
FIG. 5 is a top plan view of a blower unit configuration which can be used in the invention.

Referring now to FIGS. 2 and 5, and first to FIG. 5, a blower unit 74 for creating the increased pressure in the plenums 52, 82 below the tracks 24 and chutes 30 is illustrated. The blower unit 74 is driven by appropriate means such as a fixed speed motor 92. It will be understood, however, that any type of power means would be appropriate.

The blower unit 74 includes a first compartment 94. The compartment 94 includes therein a fan (not shown) which can centrifugally or otherwise blow air to the inlet fitting 34 of the distribution member 28. The air is drawn into the compartment 94 from the ambient air in the room. It can be filtered by filtration means 96 and introduced into the fan area of the compartment 94 radially proximate the axis thereof. It is, thereafter, blown through appropriate piping means 98 to the distribution member 28.

Ambient room temperature air is sufficient to create the flotation cushion within the distribution member 28 since, at this stage, the chips have already been tested. No special heating or cooling of the air is, therefore, necessary.

The blower unit 74 further includes a second compartment 100 or hot air compartment. Air is taken into this compartment 100 and introduced radially proximate the axis thereof through a duct 102. Although not essential to the invention, the source of air passing through the duct 102 can be air returned from the magazine 18.

The air is, thereafter, blown to the magazine 18 and, as seen in FIG. 2, through a heater unit 104. A take-off 106 downflow of the heater unit 104 can divert a portion of the air directly to the test site 14 and, conceivably, to any conveyor by which the chip carriers 12 are consecutively introduced into the test site 14.

The main conduit 108, however, provides heated air to the inlet fitting 58 to the magazine 18. The air used to provide the flotation cushion for the carriers 12 as they pass along the tracks 24, therefore, also serves to heat the chips to temperatures appropriate for testing. In the case of certain integrated circuits, it would be desireable to heat the chips to at least 160° Centigrade prior to their testing.

When a magazine 18 is provided with a plurality of tracks 24, for example ten, each track 24 being capable of accommodating twenty chip carriers, the magazine 18 can process two hundred carriers 12 without replenishment being necessary. If the handler includes means for sensing the temperature to which a chip carrier 12 is heated and means for selecting only those carriers 12 which have been heated to a sufficient temperature, any carrier 12 which has not attained the threshhold temperature will be allowed to remain within the magazine 18 to receive additional heating. Even with handlers processing as many as three carriers per second, the last carrier 12 inserted into the magazine 18 will be allowed to remain therein for in excess of one minute. If air of a high enough temperature is fed into the magazine 18, this period of time will prove sufficient to allow the carriers 12 to attain the desired temperature.

As previously indicated, because of the take-off 106 from the hot air conduit 108, the carriers 12 can be provided with heating not only in the magazine 18, but up to and including the time at which they pass through the test site 14. The temperature to which they are heated can, therefore, be maintained through their passage through the test site 14.

As discussed hereinbefore, the source of air to the hot air compartment 100 of the blower unit 74 can be return air recirculated from the magazine 18. A sealed thermal array comprising the hot air compartment 100, the heater 104, the conduit 108, the magazine 18, and the duct 102 returning the air from the magazine 18 to the hot air compartment 100 of the blower unit 74 can cooperate to minimize the energy requirements of the heater 104. Any residual heat retained by the air as it returns from the magazine 18 will serve to lessen the demands which are imposed upon the heater 104 since the air need be raised by the heater 104 only to a level sufficient to impart the necessary heat to the chip carriers 12 in order to raise them to, for example, 160° Centigrade.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined by the language in which the appended claims are expressed.

What is claimed is:

1. In combination with a test site electronically interfacing with an integrated circuit chip tester and means for consecutively introducing single chip carriers into the test site; apparatus for bringing chip carriers at least to a temperature at which they are maintained during operation of devices in which they are subsequently installed and for feeding the carriers to the consecutive introducing means, comprising:
    (a) a plurality of generally vertically spaced, sloped tracks, each having an air permeable wall down a generally upwardly facing planar surface of which chip carriers move in being fed to the consecutively introducing means;
    (b) a plurality of members, each defining a plenum beneath one of said walls;
    (c) means for generating air heated to at least a temperature at which the chip carriers are maintained during operation of the devices in which they are subsequently installed; and
    (d) means for introducing air so heated into said plenums, said introducing means including a manifold chamber communicating with each of said plenums, into which chamber heated air is channeled and from which said air is distributed to each of said plenums;
    (e) wherein, as said plenums fill with said air, pressure increases therein, and said air passes through said walls to float the carriers above said surfaces to enable them to overcome the coefficient of friction between the carriers and said surfaces.

2. Apparatus in accordance with claim 1 wherein said surfaces are sloped at angles relative to the horizontal of between 1° and 11°.

3. Apparatus in accordance with claim 2 wherein said surfaces are sloped at angles relative to the horizontal of substantially 8°.

4. Apparatus in accordance with claim 1 wherein said walls are elongated in an intended direction of movement of the chip carriers, and wherein a multiplicity of perforations are formed in each of said walls and spaced along an axis of elongation of each wall.

5. Apparatus in accordance with claim 4 wherein preforations in each wall are spaced at equal intervals and wherein said spacing is less than a dimension of a chip carrier in the intended direction of movement of the carrier.

6. Apparatus in accordance with claim 1 wherein said walls are formed from a multiplicity of beads fused together to form networks defining, on upper sides thereof, said planar surfaces.

7. Apparatus in accordance with claim 6 wherein said beads are made of glass.

8. An integrated circuit chip carrier handler system for feeding a multiplicity of chip carriers to a test site which electronically interfaces with an integrated circuit chip tester and for conveying the carrier away from the test site after being tested, comprising:
    (a) a magazine having an input end, an output end, proximate the test site, from which chip carriers are deposited into the test site, and at least one sloped track angling downwardly from said input end to said output end, said at least one track having an air-permeable wall, down a generally upwardly facing surface of which chip carriers move toward the test site;
    (b) a distribution member having an input end, proximate the test site, which chip carriers enter after exiting the test site, an output end, and at least one sloped chute angling downwardly from said input end to said output end, said at least one chute having an air-permeable wall, down a generally upwardly facing surface of which chip carriers move away from the test site; and (c) means for creating an increased pressure beneath said air-permeable walls so that air will pass through said walls to create an air film on said generally upwardly facing surfaces to facilitate movement of the chip carriers, said increased pressure creating means including a blower unit bifurcated into a hot air compartment, for providing heated air to said magazine, and an ambient temperature air compartment, for providing ambient temperature air to said distribution member.

9. A system in accordance with claim 8 wherein said heating means and said temperature maintenance means further comprise:

(a) said hot air compartment;

(b) heat generation means in communication with said hot air compartment; and (c) conduit means for delivering heated air from said hot air compartment to said magazine and the test site.

10. A system in accordance with claim 9 further comprising duct means for recirculating air delivered to said magazine and the test site back to said hot air compartment and through said heat generation means, wherein said hot air compartment, heat generation means, conduit means, magazine, duct means, and the test site together comprise a thermally sealed array.

11. A system in accordance with claim 8 wherein said means for creating an increased pressure beneath said air-permeable wall of said at least one chute comprises said ambient temperature air compartment.

12. A system in accordance with claim 8 wherein said distribution member comprises a plurality of sloped chutes angling downwardly from said input end to said output end, said chutes being spaced horizontally to define a common plane.

* * * * *

UNITED STATES PATENT AND TRADEMARK OFFICE
CERTIFICATE OF CORRECTION

PATENT NO. : 4,462,796

DATED : Jul. 31, 1984

INVENTOR(S) : Arlon J. Amundson et al

It is certified that error appears in the above-identified patent and that said Letters Patent is hereby corrected as shown below:

In Col. 7, line 46, change "ship" to --chip--.

Signed and Sealed this

Twenty-seventh Day of November 1984

[SEAL]

Attest:

GERALD J. MOSSINGHOFF

Attesting Officer     Commissioner of Patents and Trademarks